US008735808B2

(12) United States Patent
Denny et al.

(10) Patent No.: US 8,735,808 B2
(45) Date of Patent: May 27, 2014

(54) METHOD OF MASS SPECTROMETRY AND MASS SPECTROMETER USING PEAK DECONVOLUTION

(75) Inventors: Richard Denny, Newcastle-under-Lyme (GB); Keith Richardson, High Peak (GB); Martin Raymond Green, Altrincham (GB); Steven Derek Pringle, Darwen (GB); Anthony James Gilbert, High Peak (GB); John Skilling, Kenmare (IE); Jason Lee Wildgoose, Stockport (GB)

(73) Assignee: Micromass UK Limited, Wilmslow (GB)

( * ) Notice: Subject to any disclaimer, the term of this patent is extended or adjusted under 35 U.S.C. 154(b) by 0 days.

(21) Appl. No.: 13/576,344

(22) PCT Filed: Feb. 14, 2011

(86) PCT No.: PCT/GB2011/050274
§ 371 (c)(1), (2), (4) Date: Jan. 8, 2013

(87) PCT Pub. No.: WO2011/098834
PCT Pub. Date: Aug. 18, 2011

(65) Prior Publication Data

US 2013/0168546 A1 Jul. 4, 2013

Related U.S. Application Data

(60) Provisional application No. 61/307,880, filed on Feb. 25, 2010.

(30) Foreign Application Priority Data

Feb. 12, 2010 (GB) .................................. 1002447.9

(51) Int. Cl.
*H01J 49/40* (2006.01)
*G01R 23/16* (2006.01)

(52) U.S. Cl.
USPC .............................. 250/282; 250/287; 702/28

(58) Field of Classification Search
USPC .................................... 250/282, 287; 702/28
See application file for complete search history.

(56) References Cited

U.S. PATENT DOCUMENTS 5,247,175 A * 9/1993 Schoen et al. ................ 250/281
7,482,582 B2 * 1/2009 Raznikov et al. ............. 250/287

(Continued)

FOREIGN PATENT DOCUMENTS

EP 2295958 3/2011
GB 2429110 2/2007

(Continued)

OTHER PUBLICATIONS

C.D. Ghilani and P.R. Wolf, Adjustment Computations: Spatial Data Analysis, Fourth Edition, 2006 John Wiley & Sons, Inc p. 162.*

(Continued)

*Primary Examiner* — Jack Berman
*Assistant Examiner* — Kevin Chung
(74) *Attorney, Agent, or Firm* — Diederiks & Whitelaw, PLC

(57) ABSTRACT

A method of mass spectrometry is disclosed wherein a signal output from an ion detector is digitized by an Analogue to Digital Converter and is then deconvoluted to determine one or more ion arrival times and one more ion arrival intensities. The process of deconvoluting the ion signal involves determining a point spread function characteristic of an ion arriving at and being detected by the ion detector. A distribution of ion arrival times which produces a best fit to the digitised signal is then determined given that each ion arrival is assumed to produce a response given by the point spread function. A plurality of ion arrival times are then combined to produce a composite ion arrival time-intensity spectrum.

13 Claims, 5 Drawing Sheets

(56) References Cited

U.S. PATENT DOCUMENTS

| | | | | |
|---|---|---|---|---|
| 2004/0254741 | A1 | 12/2004 | Bitter et al. | |
| 2005/0086026 | A1 * | 4/2005 | LeGore et al. | 702/181 |
| 2005/0255606 | A1 * | 11/2005 | Ahmed et al. | 436/173 |
| 2006/0289746 | A1 * | 12/2006 | Raznikov et al. | 250/294 |
| 2007/0158542 | A1 * | 7/2007 | Bauer et al. | 250/282 |
| 2009/0039249 | A1 * | 2/2009 | Wang et al. | 250/287 |
| 2009/0294645 | A1 * | 12/2009 | Gorenstein et al. | 250/282 |
| 2009/0302213 | A1 * | 12/2009 | Kuehl et al. | 250/282 |
| 2009/0321628 | A1 | 12/2009 | Bateman et al. | |
| 2010/0213361 | A1 | 8/2010 | Green et al. | |
| 2011/0049353 | A1 | 3/2011 | Gilbert et al. | |

FOREIGN PATENT DOCUMENTS

| | | | |
|---|---|---|---|
| JP | 200048764 | 7/1998 | |
| JP | 2007509348 | 4/2007 | |
| JP | 2007138338 | 12/2007 | |
| JP | 2008139193 | 11/2008 | |
| JP | 2008142418 | 11/2008 | |
| WO | 92/20435 | 11/1992 | |
| WO | 2006/014984 | 2/2006 | |
| WO | 2007/112597 | 10/2007 | |
| WO | WO 2008142418 A2 * | 11/2008 | 250/252.1 |

OTHER PUBLICATIONS

Freedman et al. "Techniques to Improve the Clean Deconvolution Algorithm", *Journal of the Franklin Institute*, vol. 332B, No. 5, pp. 535-553, 1995.

Högbom, J.A. "Aperature Synthesis With a Non-Regular Distribution of Interferometer Baselines" *Astron. Astrophys. Suppl.* vol. 15, No. 3, pp. 417-426, 1974.

McKinnon G.C. et al. "Spectral Baseline Correction Using Clean", *Magnetic Resonance in Medicine, Academic Press*, vol. 13, No. 1, pp. 145-149, 1990.

* cited by examiner

METHOD OF MASS SPECTROMETRY AND MASS SPECTROMETER USING PEAK DECONVOLUTION

CROSS REFERENCE TO RELATED APPLICATIONS

This application represents a National Stage application of PCT/GB2011/050274 entitled "Method of Mass Spectrometry and Mass Spectrometer Using Peak Deconvolution" filed 14 Feb. 2011 which claims priority from and the benefit of U.S. Provisional Patent Application Ser. No. 61/307,880 filed on 25 Feb. 2010 and United Kingdom Patent Application No. 1002447.9 filed on 12 Feb. 2010. The entire contents of these applications are incorporated herein by reference.

BACKGROUND TO THE PRESENT INVENTION

The present invention relates to a method of mass spectrometry and a mass spectrometer. The preferred embodiment relates to a method of digitising signals output from an Analogue to Digital Converter and determining the arrival time and intensity of ions arriving at an ion detector.

It is known to use Time to Digital Converters ("TDC") and Analogue to Digital Converters ("ADC") as part of data recording electronics for many analytical instruments including Time of Flight mass spectrometers.

Time of Flight instruments incorporating Time to Digital Converters are known wherein signals resulting from ions arriving at an ion detector are recorded. Signals which satisfy defined detection criteria are recorded as a single binary value and are associated with a particular arrival time relative to a trigger event. A fixed amplitude threshold may be used to trigger recording of an ion arrival event. Ion arrival events which are subsequently recorded resulting from subsequent trigger events are combined to form a histogram of ion arrival events. The histogram of ion arrival events is then presented as a spectrum for further-processing. Time to Digital Converters have the advantage of being able to detect relatively weak signals so long as the probability of multiple ions arriving at the ion detector in close temporal proximity remains relatively low. One disadvantage of Time to Digital Converters is that once an ion arrival event has been recorded then there is a significant time interval or dead-time following the ion arrival event during which time no further ion arrival events can be recorded.

Another important disadvantage of Time to Digital Converters is that they are unable to distinguish between a signal resulting from the arrival of a single ion at the ion detector and a signal resulting from the simultaneous arrival of multiple ions at the ion detector. This is due to the fact that the signal will only cross the threshold once, irrespective of whether a single ion arrived at the ion detector or whether multiple ions arrived simultaneously at the ion detector. Both situations will result in only a single ion arrival event being recorded.

At relatively high signal intensities the above mentioned disadvantages coupled with the problem of dead-time effects will result in a significant number of ion arrival events failing to be recorded and/or an incorrect number of ions being recorded. This will result in an inaccurate representation of the signal intensity and an inaccurate measurement of the ion arrival time.

These effects have the result of limiting the dynamic range of the ion detector system.

Time of Flight instruments which incorporate Analogue to Digital Converters are known. An Analogue to Digital Converter is arranged to digitise signals resulting from ions arriving at an ion detector relative to a trigger event. The digitised signals resulting from subsequent trigger events are summed or averaged to produce a spectrum for further processing. A known signal averager is capable of digitising the output from ion detector electronics at a frequency of 3-6 GHz with an eight or ten bit intensity resolution.

One advantage of using an Analogue to Digital Converter as part of an ion detector system is that multiple ions which arrive substantially simultaneously at an ion detector and at relatively high signal intensities can be recorded without the ion detector suffering from distortion or saturation effects. However, the detection of low intensity signals is generally limited by electronic noise from the digitiser electronics, the ion detector and the amplifier system. The problem of electronic noise also effectively limits the dynamic range of the ion detector system.

Another disadvantage of using an Analogue to Digital Converter as part of an ion detector system (as opposed to using a Time to Digital Converter as part of the ion detector system) is that the analogue width of the signal generated by an ion arriving at the ion detector adds to the width of the ion arrival envelope for a particular mass to charge value in the final time of flight spectrum. In the case of a Time to Digital Converter, only ion arrival times are recorded and hence the width of peaks in the final spectrum is determined only by the spatial and energy focusing characteristics of the Time of Flight analyser and by timing jitter associated with TDC trigger signals and signal discriminator characteristics. For a state of the art Time of Flight detector the analogue width of the signal generated by a single ion is between 0.4-3 ns FWHM.

Recent improvements in the speed of digital processing devices have allowed the production of ion detection systems which seek to exploit the various different advantageous features of both Time to Digital Converter systems and Analogue to Digital Converter systems. Digitised transient signals are converted into arrival time and intensity pairs. The arrival time and intensity pairs from each transient are combined over a scan period into a mass spectrum. Examples of such systems are disclosed in WO2007/138338, WO2008/142418 and WO2008/139193. Each mass spectrum may comprise tens of thousands of transients. The resulting spectrum has the advantage in terms of resolution of a Time to Digital Converter system (i.e. the analogue peak width of an ion arrival does not contribute significantly to the final peak width of the spectrum). Furthermore, the system is able to record signal intensities which result from multiple simultaneous ion arrival events of the Analogue to Digital Converter. In addition, discrimination against electronic noise during detection of the individual time or mass intensity pairs virtually eliminates any electronic noise which would otherwise be present in the averaged data thereby increasing the dynamic range.

In the known methods, conversion of digitised transient signals into ion arrival time intensity pairs may involve subtraction of baseline, thresholding of data and/or application of Finite Impulse Response ("FIR") filters to all or part of the digitised signal. The aim of these processes is to reject electronic noise, locate positions within the data corresponding to ion arrival response and determine an ion arrival time and intensity associated with each ion arrival response.

As described above, each ion arrival has an associated analogue peak width. If two or more ions arrive simultaneously then these analogue peak widths may partially overlap making it impossible for a simple Finite Impulse Response filter, peak maxima or related peak detection method to isolate the arrival time and intensity of the individual ions. In such a case a response related to the average ion arrival time and summed area may be recorded rather than two individual ion arrival times an intensities. This coalescing of two or more ion arrivals within a transient into a single time intensity pair can cause artifacts in the final summed data. Furthermore, the analogue peak width from ions of different mass to charge ratio species may overlap significantly within a single transient. This will result in an inaccurate representation of the signal intensity and an inaccurate measurement of the ion arrival time for each mass to charge ratio species.

It is therefore desired to provide an improved ion detector system and an improved method of detecting ions.

SUMMARY OF THE PRESENT INVENTION

According to an aspect of the present invention there is provided a method of mass spectrometry comprising:

providing a Time of Flight mass analyser comprising an electrode for accelerating ions into a time of flight region and an ion detector arranged to detect ions after the ions have passed through the time of flight region;

digitising a first signal output from the ion detector to produce a first digitised signal;

de-convoluting the first digitised signal and determining one or more first ion arrival times and one or more first ion arrival intensities associated with the first digitised signal;

digitising a second signal output from the ion detector to produce a second digitised signal;

de-convoluting the second digitised signal and determining one or more second ion arrival times and one or more second ion arrival intensities associated with the second digitised signal;

digitising third and further signals output from the ion detector to produce third and further digitised signals;

de-convoluting the third and further digitised signals and determining one or more third and further ion arrival times and one or more third and further ion arrival intensities associated with the third and further digitised signals; and combining the one or more first ion arrival times, the one or more second ion arrival times and the one or more third and further ion arrival times and combining the one or more first ion arrival intensities, the one or more second ion arrival intensities and the one or more third and further ion arrival intensities to produce a combined ion arrival time-intensity spectrum.

According to the preferred embodiment ions are mass analysed by a Time of Flight mass analyser. The ion detector associated with the Time of Flight mass analyser outputs a signal which is digitised by an Analogue to Digital Converter. The digitised signal is then deconvoluted. The step of de-convoluting a digitised signal is different from and should not be construed as a method of conventional peak detection. Instead, according to the preferred embodiment the step of de-convoluting the digitised signal comprises determining a distribution of ion arrival times which will produce a best fit to the digitised signal given that each ion arrival at the ion detector is assumed to produce a response which is characterised by a known or determined point spread function. The ion signal is preferably digitised and deconvoluted on a push-by-push basis. Further ion signals are obtained, digitised and deconvoluted in a similar manner. The individual distribution of ion arrival times are then combined to produce a composite ion arrival time-intensity spectrum. Time of flight spectra produced according to the preferred embodiment exhibit an improved more symmetrical peak shape with better valley separation. Furthermore, the mass resolution is also increased. The preferred embodiment is, therefore, particularly advantageous.

The step of digitising the first signal output from the ion detector, the step of digitising the second signal output from the ion detector and the step of digitising the third and further signals output from the ion detector preferably comprises using an Analogue to Digital Converter to digitise the first signal, the second signal and the third and further signals.

The step of de-convoluting the first digitised signal, the step of de-convoluting the second digitised signal and the step of de-convoluting the third and further digitised signals preferably comprise either: (i) determining a point spread function characteristic of an ion arriving at and being detected by the ion detector; or (ii) using a pre-determined point spread function characteristic of an ion arriving at and being detected by the ion detector.

According to an embodiment:

(i) the step of de-convoluting the first digitised signal comprises convolving the first digitised signal with the inverse of a point spread function characteristic of an ion arriving at and being detected by the ion detector; and (ii) the step of de-convoluting the second digitised signal comprises convolving the second digitised signal with the inverse of a point spread function characteristic of an ion arriving at and being detected by the ion detector; and (iii) the step of de-convoluting the third and further digitised signals comprises convolving the third and further digitised signals with the inverse of a paint spread function characteristic of an ion arriving at and being detected by the ion detector.

According to an embodiment:

(i) the step of de-convoluting the first digitised signal comprises determining a distribution of ion arrival times which produces a best fit to the first digitised signal given that each ion arrival produces a response represented by a known point spread function; and (ii) the step of de-convoluting the second digitised signal comprises determining a distribution of ion arrival times which produces a best fit to the second digitised signal given that each ion arrival produces a response represented by a known point spread function; and (iii) the step of de-convoluting the third and further digitised signals comprises determining a distribution of ion arrival times which produces a best fit to the third and further digitised signals given that each ion arrival produces a response represented by a known point spread function.

The step of determining the ion arrival time or times and ion arrival intensity or intensities associated with the first digitised signal, the second digitised signal and the third and further digitised signals preferably comprises using a fast de-convolution algorithm.

The fast de-convolution algorithm is preferably selected from the group consisting of: (i) a modified CLEAN algorithm; (ii) a Maximum Entropy method; (iii) a Fast Fourier transformation; and (iv) a non-negative least squares method.

According to an embodiment the fast de-convolution algorithm employs a known line width and shape characteristic of the signal produced by the ion detector and subsequently digitised in response to an individual ion arrival.

The method preferably further comprises converting a determined arrival time $T_0$ of an ion into a first arrival time $T_n$ and a second arrival time $T_{n+1}$ wherein n is the digitised time bin closest to $T_0$ and representing the determined intensity $S_o$ of the ion by a first intensity $S_n$ and a second intensity $S_{n+1}$ wherein:

$$T_0 = \frac{T_n S_n + T_{n+1} S_{n+1}}{S_n + S_{n+1}}$$

The step of de-convoluting the first digitised signal, the second digitised signal and the third and further digitised signals may be performed by post-processing the first digitised signal, the second digitised signal and the third and further digitised signals.

Alternatively, the step of de-convoluting the first digitised signal, the second digitised signal and the third and further digitised signals may be performed in real time using a Field Programmable Gate Array ("FPGA") or a Graphical Processor Unit ("GPA").

According to the preferred embodiment the steps of digitising a signal output from an ion detector and/or de-convoluting the digitised signal(s) is performed on a push-by-push basis i.e. a first group of ions is accelerated into the time of flight region and are detected and/or digitised and/or de-convoluted before a second group of ions is accelerated into the time of flight region.

The method preferably further comprises:

(i) accelerating a first group of ions into the time of flight region prior to the step of digitising the first signal and/or de-convoluting the first digitised signal; and/or (ii) accelerating a second group of ions into the time of flight region prior to the step of digitising the second signal and/or de-convoluting the second digitised signal; and/or (iii) accelerating a third group of ions into the time of flight region prior to the step of digitising the third signal and/or de-convoluting the third digitised signal.

According to an aspect of the present invention there is provided a mass spectrometer comprising:

a Time of Flight mass analyser comprising an electrode for accelerating ions into a time of flight region and an ion detector arranged to detect ions after the ions have passed through the time of flight region; and a control system arranged and adapted:

(i) to digitise a first signal output from the ion detector to produce a first digitised signal;

(ii) to de-convolute the first digitised signal and to determine one or more first ion arrival times and one or more first ion arrival intensities associated with the first digitised signal;

(iii) to digitise a second signal output from the ion detector to produce a second digitised signal;

(iv) to de-convolute the second digitised signal and to determine one or more second ion arrival times and one or more second ion arrival intensities associated with the second digitised signal;

(v) to digitise third and further signals output from the ion detector to produce third and further digitised signals;

(vi) to de-convolute the third and further digitised signals and to determine one or more third and further ion arrival times and one or more third and further ion arrival intensities associated with the third and further digitised signals; and (vii) to combine the one or more first ion arrival times, the one or more second ion arrival times and the one or more third and further ion arrival times and to combine the one or more first ion arrival intensities, the one or more second ion arrival intensities and the one or more third and further ion arrival intensities to produce a combined ion arrival time-intensity spectrum.

The control system is preferably arranged and adapted:

(i) to accelerate a first group of ions into the time of flight region prior to digitising the first signal and/or de-convoluting the first digitised signal; and/or (ii) to accelerate a second group of ions into the time of flight region prior to digitising the second signal and/or de-convoluting the second digitised signal; and/or (iii) to accelerate a third group of ions into the time of flight region prior to digitising the third signal and/or de-convoluting the third digitised signal.

According to an aspect of the present invention there is provided a method of mass spectrometry comprising:

providing a Time of Flight mass analyser comprising an electrode for accelerating ions into a time of flight region and an ion detector arranged to detect ions after the ions have passed through the time of flight region;

digitising a first signal output from the ion detector using an Analogue to Digital Converter to produce a first digitised signal;

de-convoluting the first digitised signal and determining one or more first ion arrival times and one or more first ion arrival intensities associated with the first digitised signal, wherein the step of de-convoluting the first digitised signal comprises determining a distribution of ion arrival times which produces a best fit to the first digitised signal given that each ion arrival produces a response represented by a known point spread function;

digitising a second signal output from the ion detector using an Analogue to Digital Converter to produce a second digitised signal;

de-convoluting the second digitised signal and determining one or more second ion arrival times and one or more second ion arrival intensities associated with the second digitised signal, wherein the step of de-convoluting the second digitised signal comprises determining a distribution of ion arrival times which produces a best fit to the second digitised signal given that each ion arrival produces a response represented by a known point spread function;

digitising third and further signals output from the ion detector using an Analogue to Digital Converter to produce third and further digitised signals;

de-convoluting the third and further digitised signals and determining one or more third and further ion arrival times and one or more third and further ion arrival intensities associated with the third and further digitised signals, wherein the step of de-convoluting the third and further digitised signals comprises determining a distribution of ion arrival times which produces a best fit to the third and further digitised signals given that each ion arrival produces a response represented by a known point spread function; and combining the one or more first ion arrival times, the one or more second ion arrival times and the one or more third and further ion arrival times and combining the one or more first ion arrival intensities, the one or more second ion arrival intensities and the one or more third and further ion arrival intensities to produce a combined ion arrival time-intensity spectrum.

The method preferably further comprises:

(i) accelerating a first group of ions into the time of flight region prior to the step of digitising the first signal and/or de-convoluting the first digitised signal; and/or (ii) accelerating a second group of ions into the time of flight region prior to the step of digitising the second signal and/or de-convoluting the second digitised signal; and/or (iii) accelerating a third group of ions into the time of flight region prior to the step of digitising the third signal and/or de-convoluting the third digitised signal.

According to an aspect of the present invention there is provided a mass spectrometer comprising:

a Time of Flight mass analyser comprising an electrode for accelerating ions into a time of flight region and an ion detector arranged to detect ions after the ions have passed through the time of flight region; and a control system arranged and adapted:

(i) to digitise a first signal output from the ion detector using an Analogue to Digital Converter to produce a first digitised signal;

(ii) to de-convolute the first digitised signal and to determine one or more first ion arrival times and one or more first ion arrival intensities associated with the first digitised signal, wherein the control system is arranged and adapted to determine a distribution of ion arrival times which produces a best fit to the first digitised signal given that each ion arrival produces a response represented by a known point spread function;

(iii) to digitise a second signal output from the ion detector using an Analogue to Digital Converter to produce a second digitised signal;

(iv) to de-convolute the second digitised signal and to determine one or more second ion arrival times and one or more second ion arrival intensities associated with the second digitised signal, wherein the control system is arranged and adapted to determine a distribution of ion arrival times which produces a best fit to the second digitised signal given that each ion arrival produces a response represented by a known point spread function;

(v) to digitise third and further signals output from the ion detector using an Analogue to Digital Converter to produce third and further digitised signals;

(vi) to de-convolute the third and further digitised signals and to determine one or more third and further ion arrival times and one or more third and further ion arrival intensities associated with the third and further digitised signals, wherein the control system is arranged and adapted to determine a distribution of ion arrival times which produces a best fit to the third and further digitised signals given that each ion arrival produces a response represented by a known point spread function; and (vii) to combine the one or more first ion arrival times, the one or more second ion arrival times and the one or more third and further ion arrival times and to combine the one or more first ion arrival intensities, the one or more second ion arrival intensities and the one or more third and further ion arrival intensities to produce a combined ion arrival time-intensity spectrum.

The control system is preferably arranged and adapted:

(i) to accelerate a first group of ions into the time of flight region prior to digitising the first signal and/or de-convoluting the first digitised signal; and/or (ii) to accelerate a second group of ions into the time of flight region prior to digitising the second signal and/or de-convoluting the second digitised signal; and/or (iii) to accelerate a third group of ions into the time of flight region prior to digitising the third signal and/or de-convoluting the third digitised signal.

The above described embodiments are intended to include embodiments wherein multiple signals are digitised and are combined to form a composite data set which is then de-convoluted.

According to an aspect of the present invention there is provided a method of mass spectrometry comprising:

providing a Time of Flight mass analyser comprising an electrode for accelerating ions into a time of flight region and an ion detector arranged to detect ions after the ions have passed through the time of flight region;

(i) accelerating a group of ions into the time of flight region;

(ii) digitising a signal output from the ion detector to produce a digitised signal;

repeating steps (i) and (ii) one or more times;

combining the digitised signals to form a first composite digitised signal;

de-convoluting the first composite digitised signal and determining one or more first ion arrival times and one or more first ion arrival intensities associated with the first composite digitised signal;

(iii) accelerating a group of ions into the time of flight region;

(iv) digitising a signal output from the ion detector to produce a digitised signal;

repeating steps (iii) and (iv) one or more times;

combining the digitised signals to form a second composite digitised signal;

de-convoluting the second composite digitised signal and determining one or more second ion arrival times and one or more second ion arrival intensities associated with the second composite digitised signal; and combining the one or more first ion arrival times and the one or more second ion arrival times and combining the one or more first ion arrival intensities and the one or more second ion arrival intensities to produce a combined ion arrival time-intensity spectrum.

According to an embodiment further groups of ions are accelerated into the time of flight region, the signal output from the ion detector is digitised and these steps are preferably repeated one or more times. The digitised signals are preferably combined to form further composite digitised signals which are then preferably de-convoluted to determine one or more arrival times and one or more ion arrival intensities.

According to an aspect of the present invention there is provided a mass spectrometer comprising:

a Time of Flight mass analyser comprising an electrode for accelerating ions into a time of flight region and an ion detector arranged to detect ions after the ions have passed through the time of flight region; and a control system arranged and adapted:

(i) to accelerate a group of ions into the time of flight region;

(ii) to digitise a signal output from the ion detector to produce a digitised signal;

to repeat steps (i) and (ii) one or more times;

to combine the digitised signals to form a first composite digitised signal;

to de-convolute the first composite digitised signal and to determine one or more first ion arrival times and one or more first ion arrival intensities associated with the first composite digitised signal;

(iii) to accelerate a group of ions into the time of flight region;

(iv) to digitise a signal output from the ion detector to produce a digitised signal;

to repeat steps (iii) and (iv) one or more times;

to combine the digitised signals to form a second composite digitised signal;

to de-convolute the second composite digitised signal and to determine one or more second ion arrival times and one or more second ion arrival intensities associated with the second composite digitised signal; and to combine the one or more first ion arrival times and the one or more second ion arrival times and to combine the one or more first ion arrival intensities and the one or more second ion arrival intensities to produce a combined ion arrival time-intensity spectrum.

According to an embodiment further groups of ions are accelerated into the time of flight region, the signal output from the ion detector is digitised and these steps are preferably repeated one or more times. The digitised signals are preferably combined to form further composite digitised signals which are then preferably de-convoluted to determine one or more arrival times and one or more ion arrival intensities.

The preferred embodiment relates to a method of mass spectrometry comprising:

digitising a first signal output from an ion detector to produce a first digitised signal;

calculating the ion arrival time or times and ion arrival intensity or intensities associated with the first digitised signal using a fast de-convolution algorithm; and combining the calculated arrival time and intensity information from multiple digitised signals to produce an ion arrival time-intensity spectrum.

It is known to use a Finite Impulse Response ("FIR") filter to process individual digitised signals resulting from ions arriving at an ion detector relative to a trigger event. A Finite Impulse Response filter may be defined by:

$$y[n] = \sum_{i=0}^{N} b_i x[n-i] \tag{1}$$

wherein n is the sample or bin number, x[n] is the input signal, y[n] is the output signal and $b_i$ are the filter coefficients.

N is known as the filter order—an $N^{th}$—order filter has (N+1) terms on the right-hand side.

Examples of Finite Impulse Response filters include single and double differential fitters and sharpening filters. These filters may be used to enhance signal response with respect to noise. The output of the filter is then used to extract information relating to the ion arrival time and intensity. For example, the zero crossing points created by application of a single differential filter are indicative of the temporal position of the apex of the digitized signal resulting from ions arriving at the ion detector.

Such filters have the advantage that they can be readily implemented in fast digital electronics such as Field Programmable Gate Arrays ("FPGA"). This enables processing of individual transients to be accomplished within timescales appropriate to Time of Flight mass spectrometers.

However, Finite Impulse Response filters have a limited ability to separate overlapping pulses. In general, the digitized signal resulting from overlapping ion arrivals must exhibit a point of inflection within the second derivative of the signal to allow overlapping peaks to be distinguished. In addition, even partially separated peaks may be incorrectly assigned due to contributions to their area or centre of mass by the close proximity of the overlapping signal.

A superior method to determine the ion arrival times of overlapping signals is to employ a method of de-convolution. In general, the object of de-convolution is to find the solution of a convolution equation of the form:

$$f*p=g \tag{2}$$

wherein g is the recorded signal and f is a signal that is desired to be recovered but has been convolved with some other signal p before it was recorded.

In the case of a Time of Flight mass spectrometer, g is the digitised signal from ion strikes within one transient recorded by an ADC, p is related to the detector response or analogue width of the signal generated by a single ion arrival and f is the actual arrival time and intensity (time intensity pair).

In general, different methods of de-convolution are known including Fourier Transform de-convolution, non-negative least squares and maximum entropy.

According to the preferred embodiment a method of de-convolution based upon a modified version of a known algorithm called "CLEAN" is employed. The CLEAN algorithm is a computational algorithm to perform deconvolution on images created in radio astronomy. The algorithm assumes that an image consists of a number of point sources. The algorithm finds the highest value in the image and subtracts a small gain of this point source convolved with the point spread function of the observation until the highest value is smaller than some threshold. Reference is made to Högborn, J. A. 1974, Astron. Astrophys. Suppl. 15, 417-426.

According to the preferred embodiment a modified version of the CLEAN algorithm may be implemented using a Field Programmable Gate Array ("FPGA") processing electronics. According to the preferred embodiment the modified CLEAN algorithm is adapted to incorporate only integer algebra and may be further adapted to deal with overlapping signals.

According to an embodiment the apparatus preferably further comprises:

(a) an ion source selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("Cl)" ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; and (xx) a Glow Discharge ("GD") ion source; and/or (b) one or more continuous or pulsed ion sources; and/or (c) one or more ion guides; and/or (d) one or more ion mobility separation devices and/or one or more Field Asymmetric Ion Mobility Spectrometer devices; and/or (e) one or more ion traps or one or more ion trapping regions; and/or (f) one or more collision, fragmentation or reaction cells selected from the group consisting of: (i) a Collisional Induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("PID") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device; (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions; (xxvii) an ion-metastable molecule reaction device for reacting ions to form adduct or product ions; (xxviii) an ion-metastable atom reaction device for reacting ions to form adduct or product ions; and (xxix) an Electron Ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser; (v) an ion trap mass analyser; (vi) a magnetic sector mass analyser; (vii) Ion Cyclotron Resonance ("ICR") mass analyser; (viii) a Fourier Transform Ion Cyclotron Resonance ("FTICR") mass analyser; (ix) an electrostatic or orbitrap mass analyser; (x) a Fourier Transform electrostatic or orbitrap mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wein filter; and/or (k) a device or ion gate for pulsing ions; and/or (l) a device for converting a substantially continuous ion beam into a pulsed ion beam.

The mass spectrometer preferably further comprises a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

BRIEF DESCRIPTION OF THE DRAWINGS

Various embodiments of the present invention will now be described, by way of example only, and with reference to the accompanying drawings in which.

DETAILED DESCRIPTION OF THE PREFERRED EMBODIMENT

Figure 1:
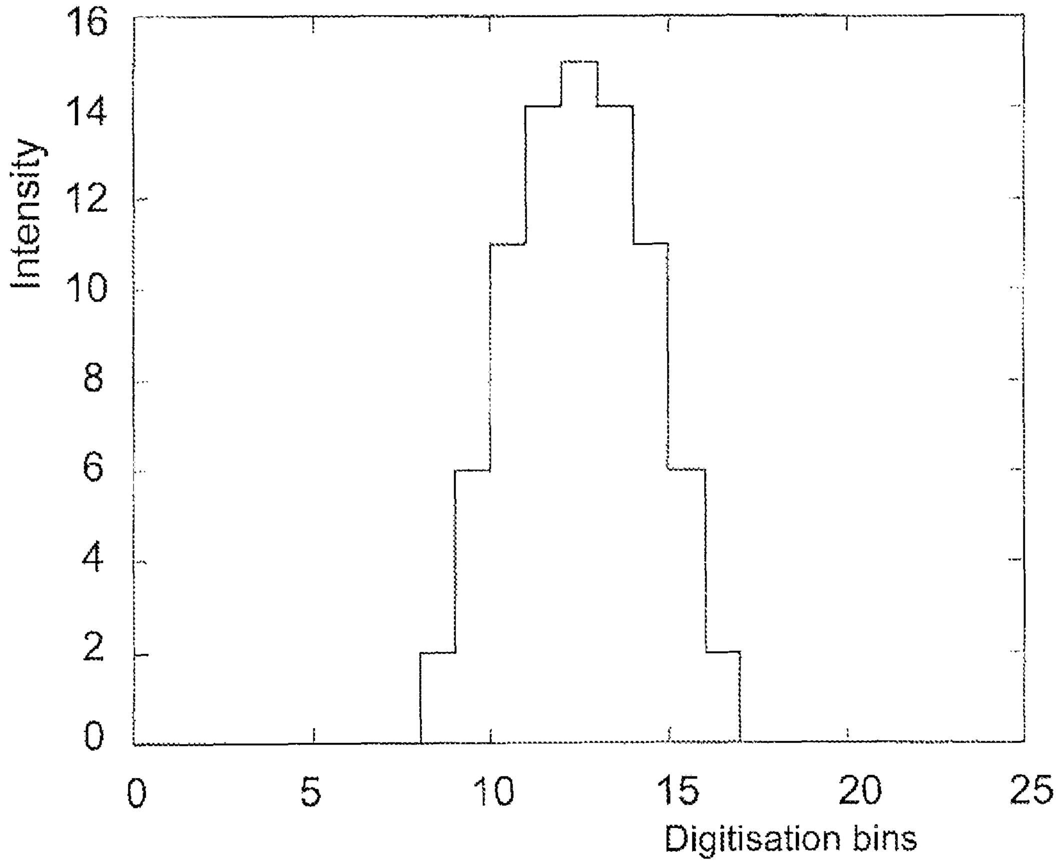
FIG. 1 shows a digitised point spread function p(x)

A preferred embodiment of the present invention will now be described. According to a preferred embodiment a Time of Flight mass analyser is provided comprising an ion detector. The output from the ion detector from each time of flight analysis is preferably digitised by an Analogue to Digital Converter ("ADC").

According to the preferred embodiment a de-convolution algorithm is applied to each time of flight spectrum and the de-convolution algorithm is adapted to employ only integer arithmetic. The method of de-convolution may be further extended to handle overlapping sources in this environment as will be described in more detail below.

According to an embodiment a fast Field Programmable Gate Array ("FPGA") architecture may be used enabling de-convolution to be performed on individual time of flight spectra without loss of duty cycle. The integer arithmetic which is employed according to the preferred embodiment is particularly suited to analysing digitised signals produced by an Analogue to Digital Converter ("ADC").

In order to illustrate aspects of the preferred embodiment, a space invariant point spread function ("PSF") p may be considered which transforms a real map f(x) to data space g(x) by convolution:

$$g(x)=\int f(t)p(x-t)dt \quad (3)$$

The point spread function represents an idealised profile of the response of an ion detector to a single ion arrival of average intensity. The real map f(x) represents the actual arrival times of individual ions and the data space g(x) represents the final recorded time of flight spectrum.

As the analogue signals from the ion detector are digitised, then the observations can be considered as appearing on a finite grid. The coarseness of the grid will depend upon the digitisation rate of the Analogue to Digital Converter. The signals will also be subject to noise. Rather than attempting to invert the transformation given above in Eqn. 3, according to the preferred embodiment f is instead inferred. Assuming for simplicity that the real map f(x) and data space g(x) are digitised on the same grid:

$$g_i = \sum_j R_{ij} f_j \text{ where } R_{ij} = p_{i-j} \quad (4)$$

The recorded data $g_i$ is corrupted by noise into observed values $y_i$. Assuming that the noise is independently distributed Gaussian, uniformly of unit variance:

$$\chi^2 = \sum_i \left( y_i - \sum_j R_{ij} f_j \right)^2 \tag{5}$$

or in matrix-vector form:

$$\chi^2 = (\underline{y} - R\underline{f})^T (\underline{y} - R\underline{f}) \tag{6}$$

Eqn. 6 may be minimised by solving the normal for $\underline{f}$:

$$\nabla\chi^2 = -2(R^T\underline{y} - R^T R\underline{f}) = 0 \tag{7}$$

This may be done incrementally, from a starting point $\underline{f}^{(0)}$ and picking an increment $\Delta\underline{f}^{(0)}$ which reduces $\chi^2$ andso on.

The vector $\underline{f}$ is a digitised account of the times of ion arrivals. The point spread function is a voltage pulse from the ion detector of average height and $y$ is the observed detector voltage trace digitised on the same grid.

FIG. 1 shows an example of a digitised point spread function p(x). This function has values 2, 6, 11, 14, 15, 14, 11, 6, 2 giving a threshold value $t=2^2+6^2+11^2+14^2+15^2/2=469$ in integer arithmetic.

The decrement in $\chi^2$ produced by incrementing the map:

$$\underline{f}^{(n+1)} = \underline{f}^{(n)} + \Delta\underline{f}^{(n)} \tag{8}$$

is:

$$\Delta\chi^2 = -2\Delta\underline{f}^{(n)T}(R^T\underline{y} - R^T R\underline{f}^{(n)}) + \Delta\underline{f}^{(n)T} R^T R \Delta\underline{f}^{(n)} \tag{9}$$

A natural increment in $\underline{f}$ is to add a single ion arrival at some time index j. Therefore, set:

$$\Delta\underline{f}^{(n)} = \begin{bmatrix} 0 \\ \vdots \\ 0 \\ 1 \\ 0 \\ \vdots \\ \vdots \\ 0 \end{bmatrix} \tag{10}$$

so that only the $j^{th}$ component is non-zero.

As a single index j is selected, incrementing the ion count by one results in:

$$\Delta\chi_j^2 = -2r_j^{(n)} = +\underline{p}^T\underline{p} \tag{11}$$

where:

$$\underline{r}^{(n)} = R^T\underline{y} - R^T R\underline{f}^{(n)} \tag{12}$$

wherein $\underline{r}^{(n)}$ is the vector of blurred residuals.

The first term in the expression for $\Delta\chi^2$ indicates that the largest decrement in $\chi^2$ will be gained by selecting the time index where the difference between the blurred data and the doubly blurred map is greatest i.e. at the maximum value in $\underline{r}^{(n)}$. A natural stopping criterion is also suggested namely that incrementing should be stopped when the difference between the blurred data and the doubly blurred map is less than half the peak value of the point spread function when it is convolved with itself.

In practice, the ion count can be incremented at all the maxima of the vector of blurred residuals $\underline{r}^{(n)}$ in a single iteration which are above the threshold for acceptance:

$$t = \underline{p}^T\underline{p}/2 \tag{13}$$

According to the preferred embodiment a modification of the CLEAN algorithm is used and may be summarised as comprising the following steps:

1. Initialising $f^{(0)}$ to be zero everywhere;
2. For n=1 to $\bar{N}$ iterations, calculating blurred residuals:

$$\underline{r} = R^T\underline{y} - R^T R\underline{f}^{(n-1)} \tag{14}$$

3. For each maximum $r_j$ in $\underline{r}$ greater than:

$$t = \underline{p}^T\underline{p}/2$$

setting:

$$f_j^{(n)} = f_j^{(n-1)} + 1 \tag{15}$$

The above procedure is particularly suited to finding the positions and intensity of a number of reasonably well isolated point sources.

A non-zero background level can also be accommodated by adjusting the threshold:

$$t = \frac{1}{2}\underline{p}^T\underline{p} + b\sum_i p_i \tag{16}$$

wherein b is the background level.

However, in the context of ion arrival rates of tens of ions per mass spectral peak per push, ion arrivals will not always be sufficiently separated for the above described procedure to be fully effective.

The problem when voltage pulses overlap is that the maxima produced may not correspond to the times of ion arrivals. In such a case the first maxima selected are likely to be more in error than subsequent maxima (found after incrementing the map). According a particularly preferred embodiment a modified CLEAN procedure as described above may be further modified to comprise what will be referred to hereinafter as the "CLEANER" procedure. The CLEANER procedure may be summarised as comprising the following steps:

1. Initialising $f^{(0)}$ to be zero everywhere;
2. For n=1 to $\bar{N}$ iterations, calculating blurred residuals:

$$\underline{r} = R^T\underline{y} - R^T R\underline{f}^{(n-1)} \tag{17}$$

3. For each $f_t^{(n-1)}>0$ with probability given by:

$$q_n = \frac{N-n}{N}$$

erode so that:

$$f_j^{(n-1)} \leftarrow f_j^{(n-1)} \tag{18}$$

4. For each maximum $r_j$ in $\underline{r}$ greater than:

$$t = \underline{p}^T\underline{p}/2$$

setting:

$$f_j^{(n)} = f_j^{(n-1)} + 1 \tag{19}$$

The erosion probability $q_n$ decreases linearly as the iteration number n progresses.

As a large number of datasets are available corresponding to the data acquired for different pushes, then the reduction in the erosion probability q can be seen as a gradual increase in the "loop gain" γ described in Högbom (1974). In effect, low values of γ are used when there is most uncertainty concerning the true ion arrival position.

In order to illustrate various aspects of the preferred embodiment a sample of bovine insulin was infused via an Electrospray ion source into an orthogonal acceleration Time of Flight mass spectrometer. The ion signal generated by $[M+5H]^{5+}$ ions being incident upon the ion detector was recorded using an 8 bit Analogue to Digital Converter with a 3 GHz digitisation rate. 926 time of flight spectra were recorded and each time of flight spectrum was de-convoluted using 128 iterations of the preferred CLEANER procedure as described above. The ion arrival locations determined for each time of flight spectrum were then summed into a final spectrum.

Figure 2:
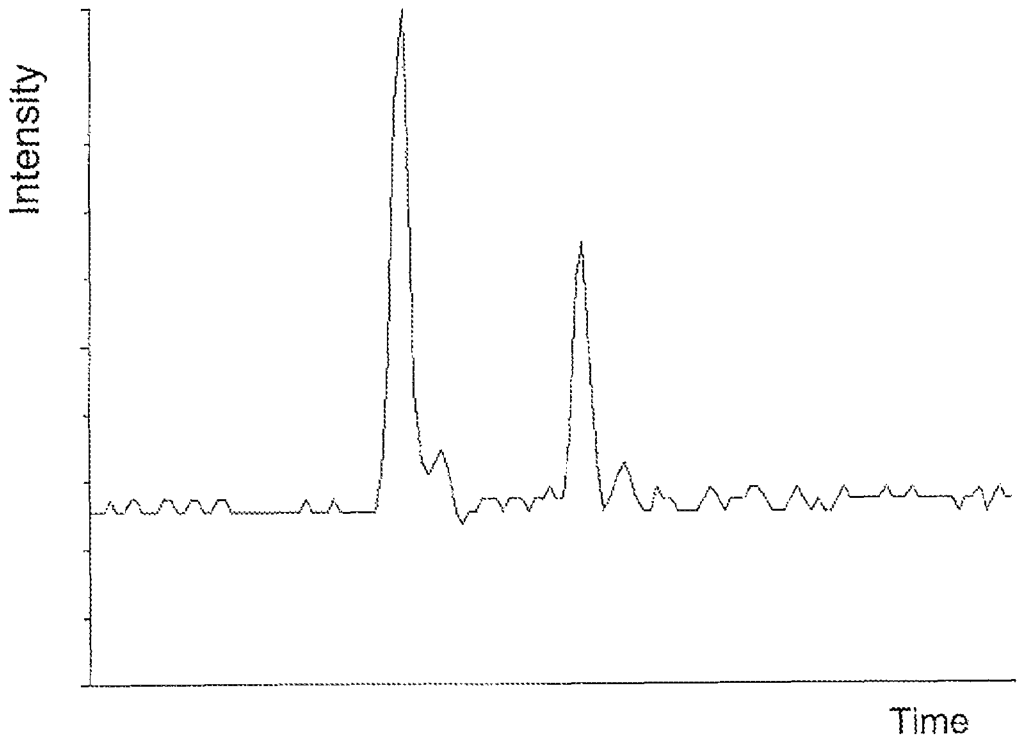
FIG. 2 shows a region of a single time of flight spectrum containing two digitised ion responses from the isotope cluster of the $[M+5H]^{5+}$ ions of bovine insulin.
Figure 3:
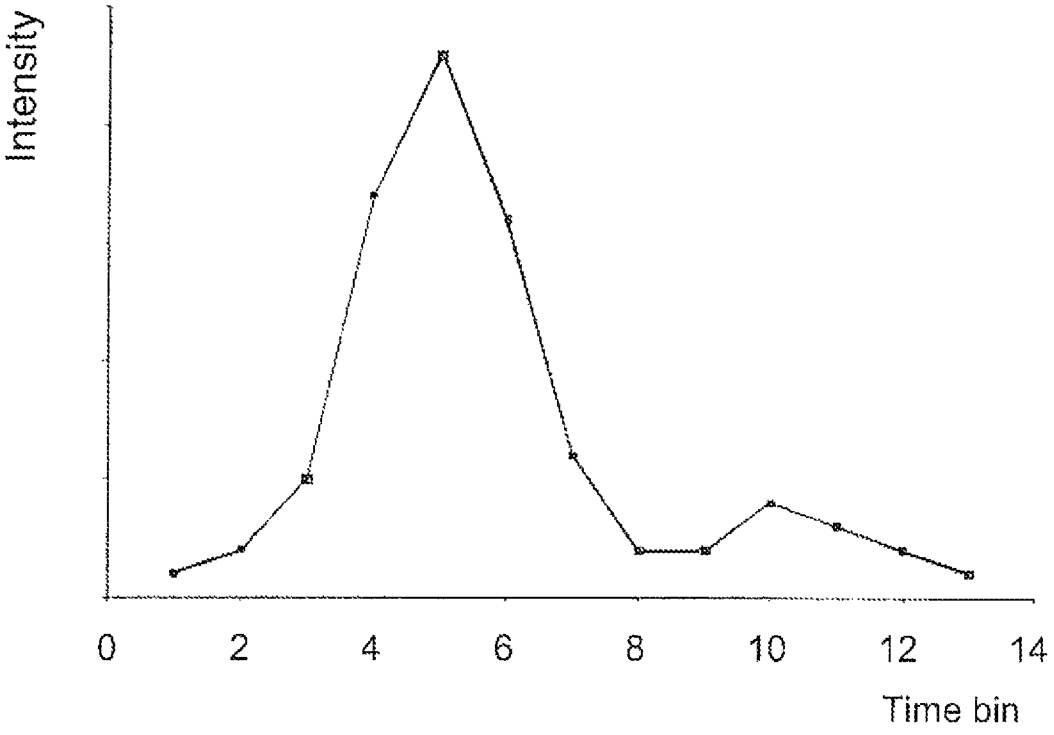
FIG. 3 shows a point spread function used in a preferred de-convolution procedure.

FIG. 2 shows a single time of flight spectrum. In this spectrum two single ion arrivals are apparent. The ions are from the isotope cluster of the $[M+5H]^{5+}$ ions of bovine insulin. From examination of the time of flight spectrum shown in FIG. 2 and from examination of other spectra containing individual ion arrivals, a point spread function representative of the characteristic shape of an ion arrival may be derived. The point spread function in this particular example is shown in FIG. 3 and consists of the intensity values 1, 2, 5, 17, 23, 16, 6, 2, 2, 4, 3, 2, 1. In this example the single ion profile is asymmetric and has a significant satellite or ringing peak after the falling edge. The satellite is caused by impedance miss matches in the detector electronics and is to a greater or lesser extent a common issue with very fast single ion response.

Figure 4A:
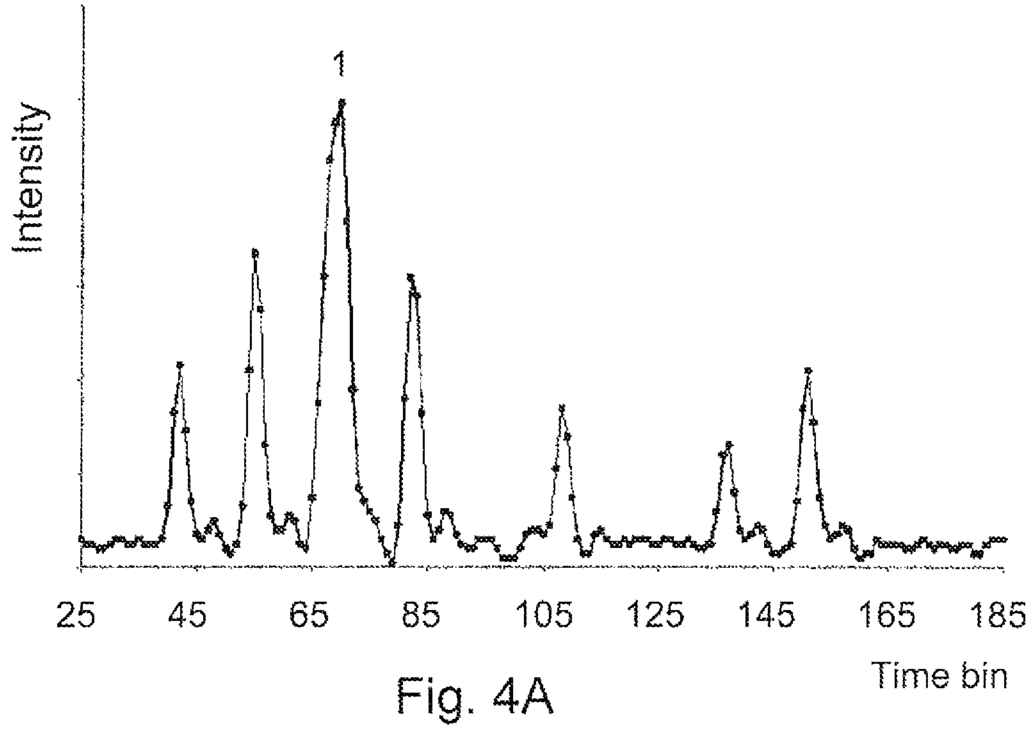
FIG. 4A shows a region of a single time of flight spectrum containing several digitised ion responses from the isotope cluster of $[M+5H]^{5+}$ ions of bovine insulin and FIG. 4B shows the ion arrival positions and intensities determined according to the preferred embodiment by de-convolution of the time of flight spectrum shown in FIG. 4A and by assuming the point spread function as shown in FIG. 3.

FIG. 4A shows time of flight spectrum number 449 from the same data set. In this case several ions have arrived at the ion detector. In the time of flight spectrum shown in FIG. 4A peak 1 is larger and broader than the signal response which would be expected from a single ion arrival. This peak is therefore likely to comprise several overlapping ion signals arriving during a narrow time window.

Figure 4B:
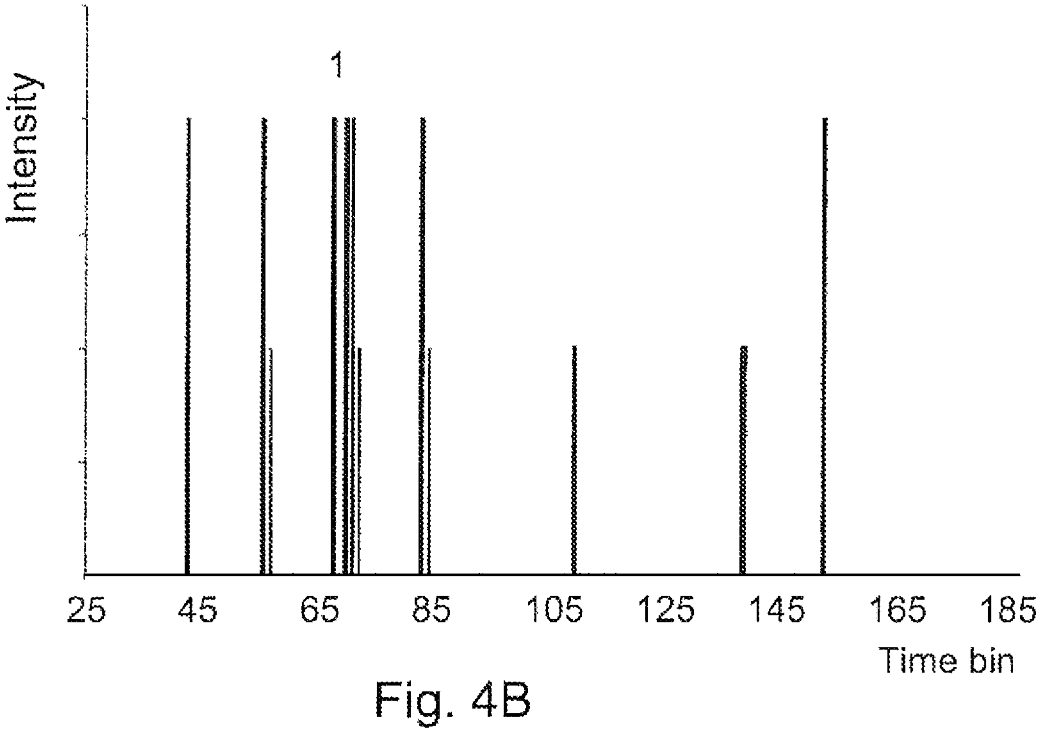

FIG. 4B shows ion arrival time positions as were calculated according to the preferred embodiment. As can be seen from FIG. 4B, peak 1 has been assigned several ion arrival values each with the point spread function as shown in FIG. 3. By way of comparison, it will be appreciated by those skilled in the art that the application of a peak detection process, such as that based upon a Finite Impulse Response filter, would detect only a single time of flight value for this signal corresponding to the centroid or apex of this signal. The resolving of a single ion peak as indicated by peak 1 in FIG. 4A into four peaks indicating seven ion arrival events over a short period of time illustrates advantageous aspects of the preferred embodiment of the present invention compared with known methods.

Figure 5A:
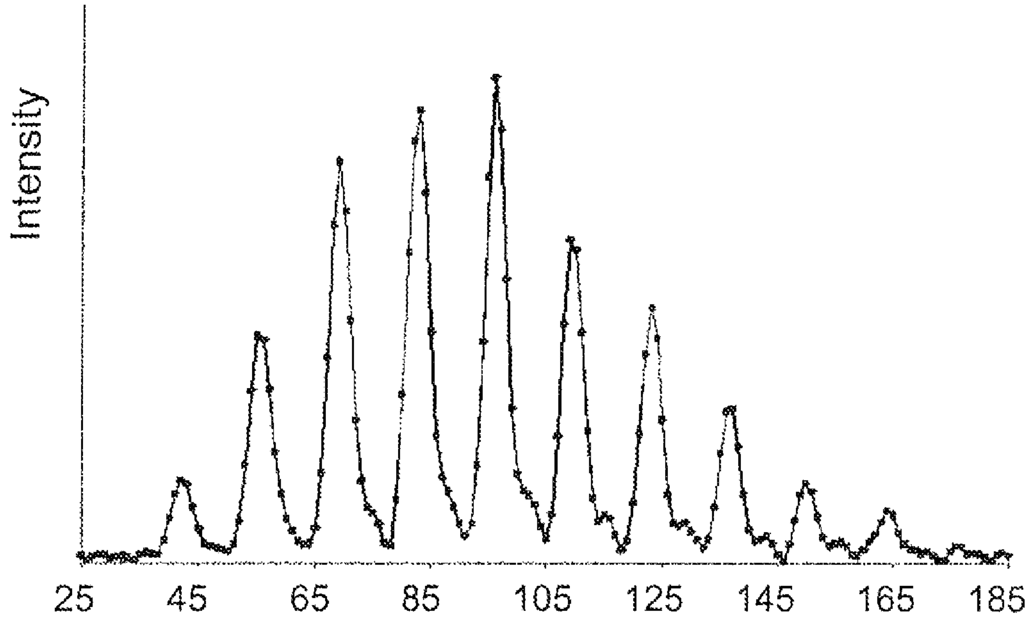
FIG. 5A shows the sum of 449 time of flight spectra in a region containing ion responses from the isotope cluster of the $[M+5H]^{5+}$ ions of bovine insulin and FIG. 5B shows the sum of the same 449 time of flight spectra after processing according to the preferred embodiment of the present invention.

FIG. 5A shows a time of flight spectrum generated by summing all 926 time of flight spectra and applying a threshold background subtraction. The isotope envelope of $5^+$ ions of bovine insulin is clearly evident. However, the asymmetry associated with each single ion arrival as shown in FIG. 2 leads to a corresponding clear asymmetry in each of the isotope peaks in the final spectrum.

Figure 5B:
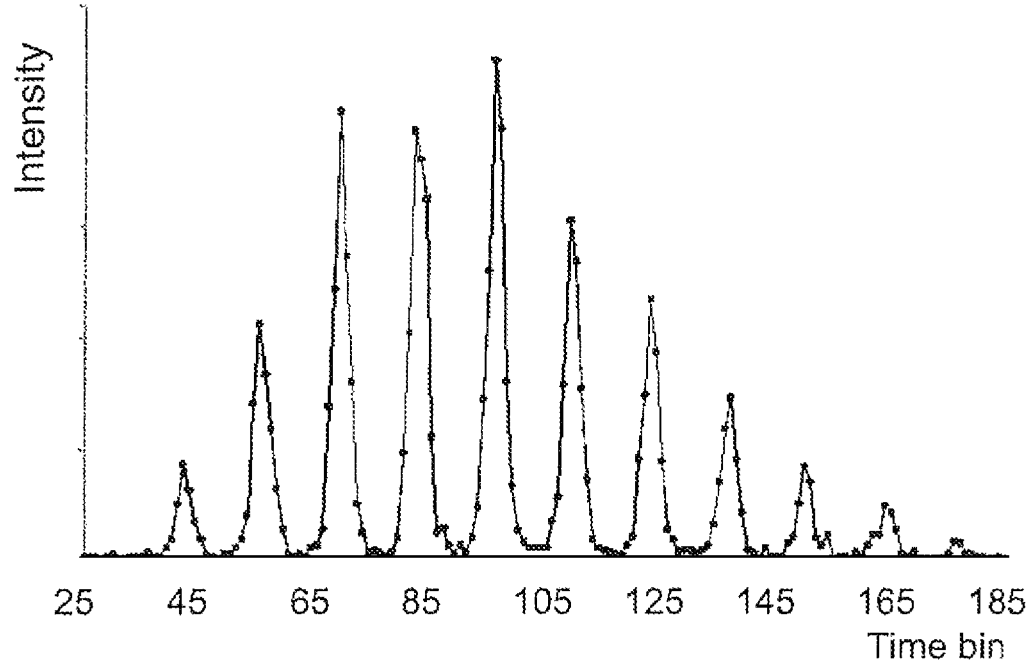

FIG. 5B shows the same data as in FIG. 5A after processing according to the preferred embodiment. In comparison with FIG. 5A, it is clear that the symmetry of the peaks is significantly improved. This leads to better peak shape and better valley separation. The ability to match the point spread function used in the de-convolution process to the characteristic ion profile of the detection system allows reduction of artefacts and tailing in the final data. In addition to these qualitative improvements, the mass resolution is also increased. This is because the contribution to peak width from the ion arrival profile which is evident in FIG. 5A is effectively removed according to the preferred embodiment.

Although in this example the data was acquired and was subsequently post processed in order to provide comparative data, the procedure according to the preferred embodiment may more preferably be implemented in real time using a Field Programmable Gate Array ("FPGA") or a Graphical Processor Unit ("GPU") architecture.

In the method described above the ion arrival time is preferably determined to a precision of +/−half of a digitisation bin width. However, other embodiments are contemplated wherein the method may be modified to allow ion arrival times to be determined to a precision less than half of the digitisation precision of the incoming signal. This may be achieved by effectively up-sampling the point spread function compared to the data and/or by up-sampling the data by interpolation prior to deconvolution.

Alternatively, rather than recording the maximum of the response in the blurred residuals which exceeds the threshold of acceptance to within one digitising bin, the maxima may be recorded more precisely by interpolation of the apex of the blurred residuals or by calculating a weighted centroid of the signal.

If the ion arrival time is determined with high precision, a finer grid spacing than that of the original digitised data may be used during combining of the individual de-convoluted time of flight spectra. This will result in a final mass spectrum with an apparent higher digitisation rate than the original data.

In addition, if the ion arrival time is determined with high precision, then this precision may be retained in the final data by converting the determined arrival time $T_0$ of the ion into a first arrival time $T_n$ and a second arrival time $T_{n+1}$ wherein n is the digitised time bin closest to $T_0$ and by representing the determined intensity $S_o$ of the ion by a first intensity $S_n$ and a second intensity $S_{n+1}$ wherein:

$$T_0 = \frac{T_n S_n + T_{n+1} S_{n+1}}{S_n + S_{n+1}} \tag{20}$$

Although the present invention has been described with reference to preferred embodiments, it will be understood by those skilled in the art that various changes in form and detail may be made without departing from the scope of the present invention as set forth in the accompanying claims.

The invention claimed is:

1. A method of mass spectrometry comprising:

providing a Time of Flight mass analyser comprising an electrode for accelerating ions into a time of flight region and an ion detector arranged to detect ions after said ions have passed through said time of flight region;

digitising a first signal output from said ion detector to produce a first digitised signal;

de-convoluting said first digitised signal and determining one or more first ion arrival times and one or more first ion arrival intensities associated with said first digitised signal;

digitising a second signal output from said ion detector to produce a second digitised signal;

de-convoluting said second digitised signal and determining one or more second ion arrival times and one or more second ion arrival intensities associated with said second digitised signal;

digitising third and further signals output from said ion detector to produce third and further digitised signals;

de-convoluting said third and further digitised signals and determining one or more third and further ion arrival times and one or more third and further ion arrival intensities associated with said third and further digitised signals; and combining said one or more first ion arrival times, said one or more second ion arrival times and said one or more third and further ion arrival times and combining said one or more first ion arrival intensities, said one or more second ion arrival intensities and said one or more third and further ion arrival intensities to produce a combined ion arrival time-intensity spectrum, wherein said step of digitising said first signal output from said ion detector, said step of digitising said second signal output from said ion detector and said step of digitising said third and further signals output from said ion detector comprise using an Analogue to Digital Converter to digitise said first signal, said second signal and said third and further signals, and wherein said step of de-convoluting said first digitised signal, said step of de-convoluting said second digitised signal and said step of de-convoluting said third and further digitised signals comprise either: (i) determining a point spread function characteristic of a single ion arriving at and being detected by said ion detector; or (ii) using a pre-determined point spread function characteristic of a single ion arriving at and being detected by said ion detector.

2. A method as claimed in claim 1, wherein:

(i) said step of de-convoluting said first digitised signal comprises convolving said first digitised signal with an inverse of a point spread function characteristic of an ion arriving at and being detected by said ion detector; and (ii) said step of de-convoluting said second digitised signal comprises convolving said second digitised signal with the inverse of a point spread function characteristic of an ion arriving at and being detected by said ion detector; and (iii) said step of de-convoluting said third and further digitised signals comprises convolving said third and further digitised signals with the inverse of a point spread function characteristic of an ion arriving at and being detected by said ion detector.

3. A method of mass spectrometry as claimed claim 1, wherein:

(i) said step of de-convoluting said first digitised signal comprises determining a distribution of ion arrival times which produces a best fit to said first digitised signal given that each ion arrival produces a response represented by a known point spread function; and (ii) said step of de-convoluting said second digitised signal comprises determining a distribution of ion arrival times which produces a best fit to said second digitised signal given that each ion arrival produces a response represented by a known point spread function; and (iii) said step of de-convoluting said third and further digitised signals comprises determining a distribution of ion arrival times which produces a best fit to said third and further digitised signals given that each ion arrival produces a response represented by a known point spread function.

4. A method of mass spectrometry as claimed in claim 1, wherein said step of determining the ion arrival time or times and ion arrival intensity or intensities associated with said first digitised signal, said second digitised signal and said third and further digitised signals comprises using a de-convolution algorithm selected from a group consisting of: (i) a modified CLEAN algorithm; (ii) a Maximum Entropy method; (iii) a Fast Fourier transformation; and (iv) a non-negative least squares method.

5. A method of mass spectrometry as claimed in claim 4, wherein said de-convolution algorithm employs a known line width and shape characteristic of the signal produced by said ion detector and subsequently digitised in response to an individual ion arrival.

6. A method as claimed in claim 1, further comprising converting a determined arrival time $T_0$ of an ion into a first arrival time $T_n$ and a second arrival time $T_{n+1}$ wherein n is a digitised time bin closest to $T_0$ and representing a determined intensity $S_o$ of the ion by a first intensity $S_n$ and a second intensity $S_{n+1}$ wherein:

$$T_0 = \frac{T_n S_n + T_{n+1} S_{n+1}}{S_n + S_{n+1}}.$$

7. A method of mass spectrometry as claimed in claim 1, wherein said step of de-convoluting said first digitised signal, said second digitised signal and said third and further digitised signals is performed by post-processing said first digitised signal, said second digitised signal and said third and further digitised signals.

8. A method of mass spectrometry as claimed in claim 1, wherein said step of de-convoluting said first digitised signal, said second digitised signal and said third and further digitised signals is performed in real time using a Field Programmable Gate Array ("FPGA") or a Graphical Processor Unit ("GPA").

9. A method of mass spectrometry as claimed in claim 1, further comprising:

(i) accelerating a first group of ions into said time of flight region prior to the step of digitising said first signal and de-convoluting said first digitised signal;

(ii) accelerating a second group of ions into said time of flight region prior to the step of digitising said second signal and de-convoluting said second digitised signal; and (iii) accelerating a third group of ions into said time of flight region prior to the step of digitising said third signal and de-convoluting said third digitised signal.

10. A mass spectrometer comprising:

a Time of Flight mass analyser comprising an electrode for accelerating ions into a time of flight region and an ion detector arranged to detect ions after said ions have passed through said time of flight region; and a control system arranged and adapted:

(i) to digitise a first signal output from said ion detector to produce a first digitised signal;

(ii) to de-convolute said first digitised signal and to determine one or more first ion arrival times and one or more first ion arrival intensities associated with said first digitised signal;

(iii) to digitise a second signal output from said ion detector to produce a second digitised signal;

(iv) to de-convolute said second digitised signal and to determine one or more second ion arrival times and one or more second ion arrival intensities associated with said second digitised signal;

(v) to digitise third and further signals output from said ion detector to produce third and further digitised signals;

(vi) to de-convolute said third and further digitised signals and to determine one or more third and further ion arrival times and one or more third and further ion arrival intensities associated with said third and further digitised signals; and (vii) to combine said one or more first ion arrival times, said one or more second ion arrival times and said one or more third and further ion arrival times and to combine said one or more first ion arrival intensities, said one or more second ion arrival intensities and said one or more third and further ion arrival intensities to produce a combined ion arrival time-intensity spectrum, wherein said control system is arranged and adapted to digitise said first signal output from said ion detector, to digitise said second signal output from said ion detector and to digitise said third and further signals output from said ion detector using an Analogue to Digital Converter to digitise said first signal, said second signal and said third and further signals, and wherein said de-convoluting said first digitised signal, said de-convoluting said second digitised signal and said de-convoluting said third and further digitised signals comprise either: (i) determining a point spread function characteristic of a single ion arriving at and being detected by said ion detector; or (ii) using a pre-determined point spread function characteristic of a single ion arriving at and being detected by said ion detector.

11. A mass spectrometer as claimed in claim 10, wherein said control system is arranged and adapted:

(i) to accelerate a first group of ions into said time of flight region prior to digitising said first signal and de-convoluting said first digitised signal;

(ii) to accelerate a second group of ions into said time of flight region prior to digitising said second signal and de-convoluting said second digitised signal; and (iii) to accelerate a third group of ions into said time of flight region prior to digitising said third signal and de-convoluting said third digitised signal.

12. A method of mass spectrometry comprising:

providing a Time of Flight mass analyser comprising an electrode for accelerating ions into a time of flight region and an ion detector arranged to detect ions after said ions have passed through said time of flight region;

(i) accelerating a group of ions into said time of flight region;

(ii) digitising a signal output from said ion detector using an Analogue to Digital Converter to produce a digitised signal;

repeating steps (i) and (ii) one or more times;

combining the digitised signals to form a first composite digitised signal;

de-convoluting said first composite digitised signal and determining one or more first ion arrival times and one or more first ion arrival intensities associated with said first composite digitised signal;

(iii) accelerating a group of ions into said time of flight region;

(iv) digitising a signal output from said ion detector using an Analogue to Digital Converter to produce a digitised signal;

repeating steps (iii) and (iv) one or more times;

combining the digitised signals to form a second composite digitised signal;

de-convoluting said second composite digitised signal and determining one or more second ion arrival times and one or more second ion arrival intensities associated with said second composite digitised signal; and combining said one or more first ion arrival times and said one or more second ion arrival times and combining said one or more first ion arrival intensities and said one or more second ion arrival intensities to produce a combined ion arrival time-intensity spectrum, wherein said step of de-convoluting said first composite digitised signal and said step of de-convoluting said second composite digitised signal comprise either: (i) determining a point spread function characteristic of a single ion arriving at and being detected by said ion detector; or (ii) using a pre-determined point spread function characteristic of a single ion arriving at and being detected by said ion detector.

13. A mass spectrometer comprising:

a Time of Flight mass analyser comprising an electrode for accelerating ions into a time of flight region and an ion detector arranged to detect ions after said ions have passed through said time of flight region; and a control system arranged and adapted:

(i) to accelerate a group of ions into said time of flight region;

(ii) to digitise a signal output from said ion detector using an Analogue to Digital Converter to produce a digitised signal;

to repeat steps (i) and (ii) one or more times;

to combine the digitised signals to form a first composite digitised signal;

to de-convolute said first composite digitised signal and to determine one or more first ion arrival times and one or more first ion arrival intensities associated with said first composite digitised signal;

(iii) to accelerate a group of ions into said time of flight region;

(iv) to digitise a signal output from said ion detector using an Analogue to Digital Converter to produce a digitised signal;

to repeat steps (iii) and (iv) one or more times;

to combine the digitised signals to form a second composite digitised signal;

to de-convolute said second composite digitised signal and to determine one or more second ion arrival times and one or more second ion arrival intensities associated with said second composite digitised signal; and to combine said one or more first ion arrival times and said one or more second ion arrival times and to combine said one or more first ion arrival intensities and said one or more second ion arrival intensities to produce a combined ion arrival time-intensity spectrum, wherein said de-convoluting said first digitised signal and said de-convoluting said second digitised signal comprise either: (i) determining a point spread function characteristic of a single ion arriving at and being detected by said ion detector; or (ii) using a pre-determined point spread function characteristic of a single ion arriving at and being detected by said ion detector.

* * * * *